(12) United States Patent
Mun et al.

(10) Patent No.: US 7,893,526 B2
(45) Date of Patent: Feb. 22, 2011

(54) SEMICONDUCTOR PACKAGE APPARATUS

(75) Inventors: Sung-ho Mun, Suwon-si (KR); Sun-won Kang, Seoul (KR); Seung-duk Baek, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 239 days.

(21) Appl. No.: 12/220,996

(22) Filed: Jul. 30, 2008

(65) Prior Publication Data

US 2009/0051045 A1   Feb. 26, 2009

(30) Foreign Application Priority Data

Aug. 21, 2007   (KR) ...................... 10-2007-0084031

(51) Int. Cl.
*H01L 23/52*   (2006.01)
(52) U.S. Cl. ...................... 257/691; 257/678; 257/690; 257/723; 257/777; 257/686; 257/E23.153
(58) Field of Classification Search ......... 257/678–733, 257/787–796, E23.001–E23.194
See application file for complete search history.

(56) References Cited

U.S. PATENT DOCUMENTS

| | | | |
|---|---|---|---|
| 5,404,044 A * | 4/1995 | Booth et al. | 257/698 |
| 6,355,978 B1 * | 3/2002 | Watanabe | 257/700 |
| 6,639,299 B2 | 10/2003 | Aoki | |
| 6,768,189 B1 | 7/2004 | Anderson et al. | |
| 2002/0149086 A1 | 10/2002 | Aoki | |
| 2007/0284704 A1 * | 12/2007 | Leal et al. | 257/666 |

FOREIGN PATENT DOCUMENTS

| | | |
|---|---|---|
| JP | 2002-314028 | 10/2002 |
| KR | 2000-0050477 | 8/2000 |

\* cited by examiner

*Primary Examiner*—Jasmine J Clark
(74) *Attorney, Agent, or Firm*—Mills & Onello, LLP

(57) ABSTRACT

A semiconductor package apparatus comprises: at least one semiconductor chip; and a circuit board on which the semiconductor chip is installed, wherein at least one conductive plane for improving power and/or ground characteristics is positioned on a side of the semiconductor chip. In this manner, fabrication cost for the semiconductor package apparatus can be mitigated, and power and/or ground characteristics can be improved so as to readily control impedance of signal lines. As a result, reliability of the operation of the semiconductor package apparatus can be improved, and noise and malfunction can be prevented.

15 Claims, 5 Drawing Sheets

SEMICONDUCTOR PACKAGE APPARATUS

CROSS-REFERENCE TO RELATED PATENT APPLICATION

This application claims the benefit of Korean Patent Application No. 10-2007-0084031, filed on Aug. 21, 2007, in the Korean Intellectual Property Office, the disclosure of which is incorporated herein in its entirety by reference.

BACKGROUND OF THE INVENTION

1. Field of the Invention

Embodiments of the present invention relate to a semiconductor package apparatus and method of manufacture thereof, and more particularly, to a semiconductor package apparatus for improving electrical characteristics such as power and/or ground distribution, etc. and more stable control over impedance properties.

2. Description of the Related Art

In general, the development of semiconductor packages used in electronic products has been continuous and rapid in an effort to keep pace with the tendency toward miniaturization of the electronic products. Examples of such semiconductor packages include flip chip packages, wafer level packages, wafer level stack packages, and the like.

In particular, there has been widely used a 3-dimensional (3-D) stack technique of a chip stack package in which a plurality of semiconductor chips are stacked on a circuit board so as to enable high-capacity integration. It has been a challenge to control electrical characteristics between the semiconductor chips and signal lines formed on a circuit board, for example, controlling the impedance of a packaged device. As a result, power and/or ground characteristics are adversely affected and noise can be generated, and thus, reliability of the operation of the packaged device is lowered, resulting in higher likelihood of malfunction.

SUMMARY OF THE INVENTION

Embodiments of the present invention provide a semiconductor package apparatus in which a conductive plane configuration improves power and/or ground characteristics on a side of a semiconductor chip stacked on a circuit board, and a method of manufacture thereof. This helps to control impedance characteristics of the signal lines. In addition, costs are reduced for fabricating a multi-layer circuit board.

In one aspect, a semiconductor package apparatus comprises: at least one semiconductor chip; and a circuit board on which the semiconductor chip is installed, wherein at least one conductive plane for improving power and/or ground characteristics is positioned on a side of the semiconductor chip.

In one embodiment, the semiconductor package apparatus is a chip stack package type apparatus in which a plurality of semiconductor chips are stacked and electrically connected to one another.

In another embodiment, a conductive plane is positioned on a side of each of the plurality of semiconductor chips.

In another embodiment, the semiconductor chip is electrically connected to at least one upper semiconductor chip by a through-silicon via that penetrates the semiconductor chips.

In another embodiment, an interlayer adhesive layer is positioned between the semiconductor chip and the circuit board.

In another embodiment, the circuit board comprises a solder resist and a core, wherein signal lines are formed on a side of the core below the solder resist and oriented to face the conductive plane.

In another embodiment, the conductive plane comprises at least one metal plane that is formed of a metal material.

In another embodiment, the conductive plane comprises at least one of a power plane, a ground plane, and a combination of the power and ground planes, wherein the power plane is to improve a power characteristic, and wherein the ground plane is to improve a ground characteristic.

In another embodiment, the semiconductor package apparatus further comprises connectors electrically connecting the conductive plane to the circuit board.

In another embodiment, the connectors comprise at least one through-silicon via that penetrates the semiconductor chips.

In another embodiment, the connectors electrically connect the conductive plane to at least one of a power net and a ground net of the circuit board.

In another embodiment, a conductive plane is positioned on a backside of the semiconductor chip.

In another embodiment, the conductive plane is formed on a side of the lowermost semiconductor chip nearest to the circuit board.

In another embodiment, multiple conductive planes are disposed on the same plane on a side of the semiconductor chip.

In another embodiment, a conductive plane comprises multiple, stacked conductive planes that are insulated from one another on a backside of the semiconductor chip.

According to another aspect of the present invention, there is provided a method of fabricating a semiconductor package apparatus, including: fabricating a semiconductor chip including a side on which an active surface is formed and another side on which a conductive plane is formed; fabricating a circuit board including a side on which signal lines are formed; and installing the semiconductor chip on the circuit board so that the conductive plane of the semiconductor chip faces and is electrically connected to the signal lines. The fabrication of the semiconductor chip may include forming the conductive plane on a backside of a wafer when the wafer is fabricated.

BRIEF DESCRIPTION OF THE DRAWINGS

The above and other features and advantages of the embodiments of the present invention will become more apparent by describing in detail exemplary embodiments thereof with reference to the attached drawings in which.

FIG: 8 is a cross-sectional view of a semiconductor package apparatus according to another embodiment of the present invention.

DETAILED DESCRIPTION OF EMBODIMENTS

A semiconductor package apparatus and a method of fabricating the semiconductor package apparatus according to embodiments of the present invention will now be described in detail with reference to the attached drawings.

Figure 1:
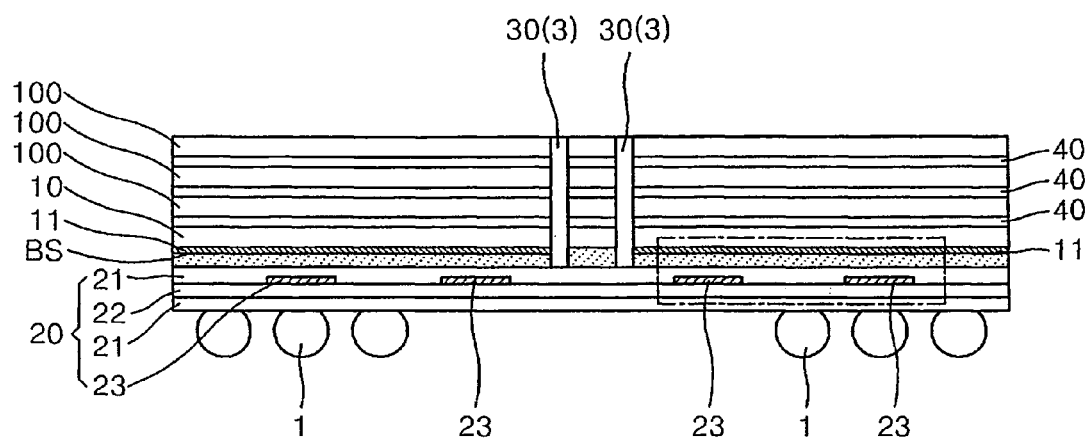
FIG. 1 is a cross-sectional view of a semiconductor package apparatus according to an embodiment of the present invention.

As shown in FIG. 1, a semiconductor package apparatus according to an embodiment of the present invention includes semiconductor chips 10 and 100 and a circuit board 20. At least one conductive plane 11 is formed on a surface of at least one of the semiconductor chips 10, particularly, in the embodiment shown, on a backside (BS) of the lowermost semiconductor chip 10. The conductive plane 11 is used to improve power and/or ground characteristics of the resulting device.

Here, the semiconductor package apparatus of the present embodiment is a chip stack package type apparatus in which the lowermost semiconductor chip 10 is stacked along with a plurality of upper semiconductor chips 100 so that the semiconductor chips 10 and 100 are electrically connected to one another. Conductive through-silicon vias 30 are formed to penetrate the semiconductor chips 10 and 100. The semiconductor chips 10 and 100 are electrically connected to one another by the through-silicon vias 30.

In particular, the conductive plane 11 is formed on the BS of the lowermost semiconductor chip 10 nearest to signal lines 23 of the circuit board 20.

Also, the through silicon vias 30 may be various types of through vias that are formed of various kinds of materials to penetrate the semiconductor chips 10 and 100 so as to electrically connect the semiconductor chips 10 and 100 to one another.

Interlayer adhesive layers 40 may be formed among the semiconductor chips 10 and 100 to firmly adhere the semiconductor chips 10 and 100 to the circuit board 20. Also, an interlayer adhesive layer 40 may be additionally formed between the semiconductor chip 10 and the circuit board 20. Here, the interlayer adhesive layers 40 may be formed of various kinds of adhesives or various kinds of adhesive resin materials.

Figure 2:
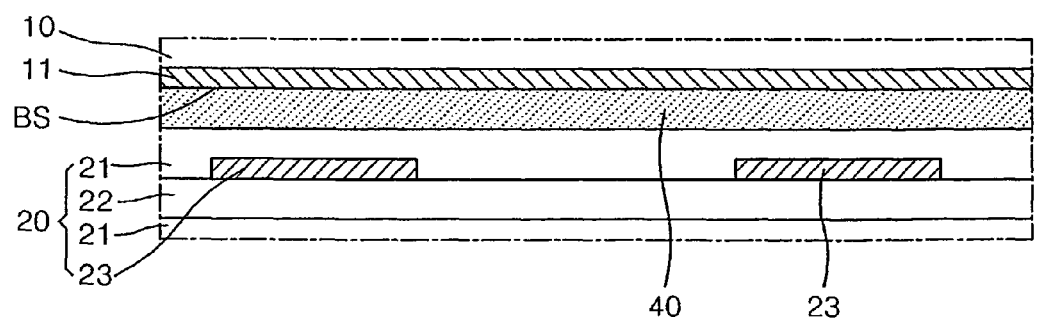
FIG. 2 is an enlarged cross-sectional view of a portion of the semiconductor package apparatus of FIG. 1 marked with a dashed line.

The lowermost semiconductor chip 10 is installed on the circuit board 20. As shown in FIGS. 1 and 2, the signal lines 23 are formed on a surface of a core 22 to be protected by a solder resist 21 and are oriented to face the conductive plane 11. Solder balls 1 are formed on a lower surface of the solder resist 21.

The conductive plane 11 can be formed of one of various kinds of conductive materials. In one embodiment, the conductive plane 11 is a metal plane formed of a metal material.

Here, ion injection, diffusion, sputtering, plating, metal plane bonding, etc. for forming a metal plane on a surface of wafer may be adopted in order to form the conductive plane 11.

Figure 3:
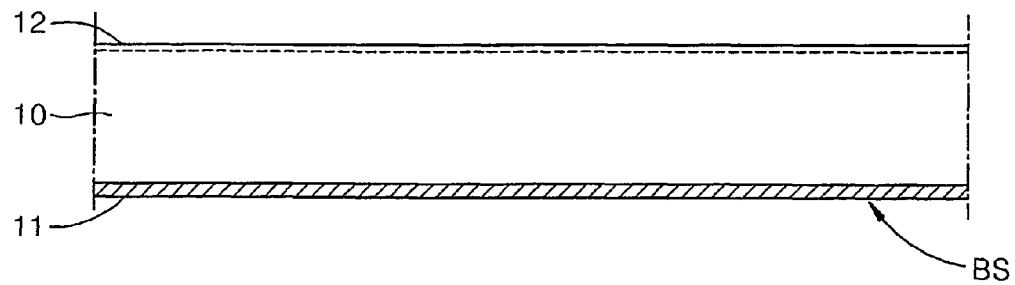
FIG. 3 is an enlarged cross-sectional view of a portion of a lowermost semiconductor chip of FIG. 1, according to an embodiment of the present invention.
Figure 4:
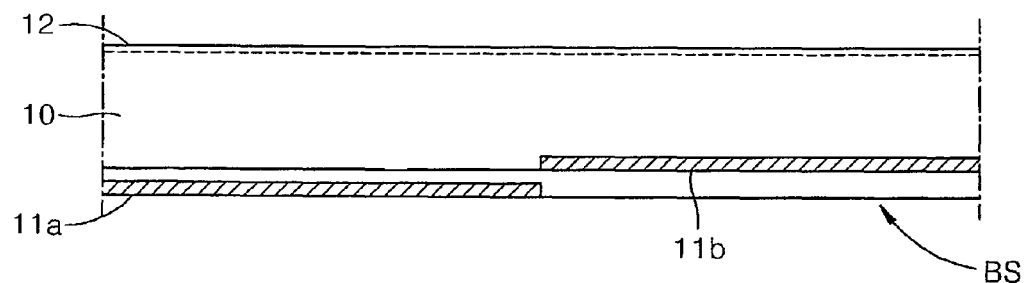
FIG. 4 is an enlarged cross-sectional view of the portion of the lowermost semiconductor chip of FIG. 3, according to another embodiment of the present invention.
Figure 5:
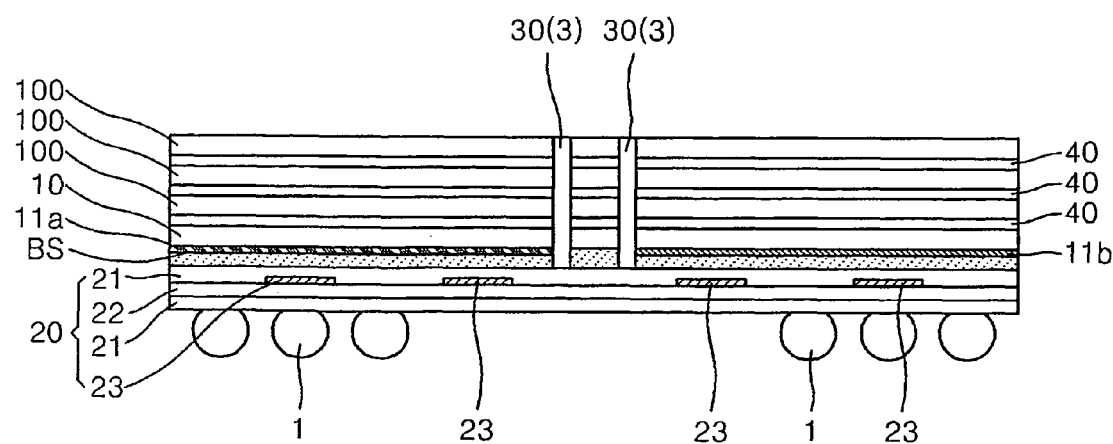
FIG. 5 is a cross-sectional view of a semiconductor package apparatus according to another embodiment of the present invention.

The conductive plane 11 can be functionally classified as a power plane or a ground plane. A conductive plane that operates as a power plane improves power characteristics in the resulting device, and a conductive plane that operates as a ground plane improves ground characteristics in the resulting device. As shown in FIGS. 1, 2, and 3, the conductive plane 11 can comprise either the power plane or the ground plane. Alternatively, as shown in the embodiments of FIGS. 4 and 5, both a power plane 11a and a ground plane 11b can be included.

Figure 6:
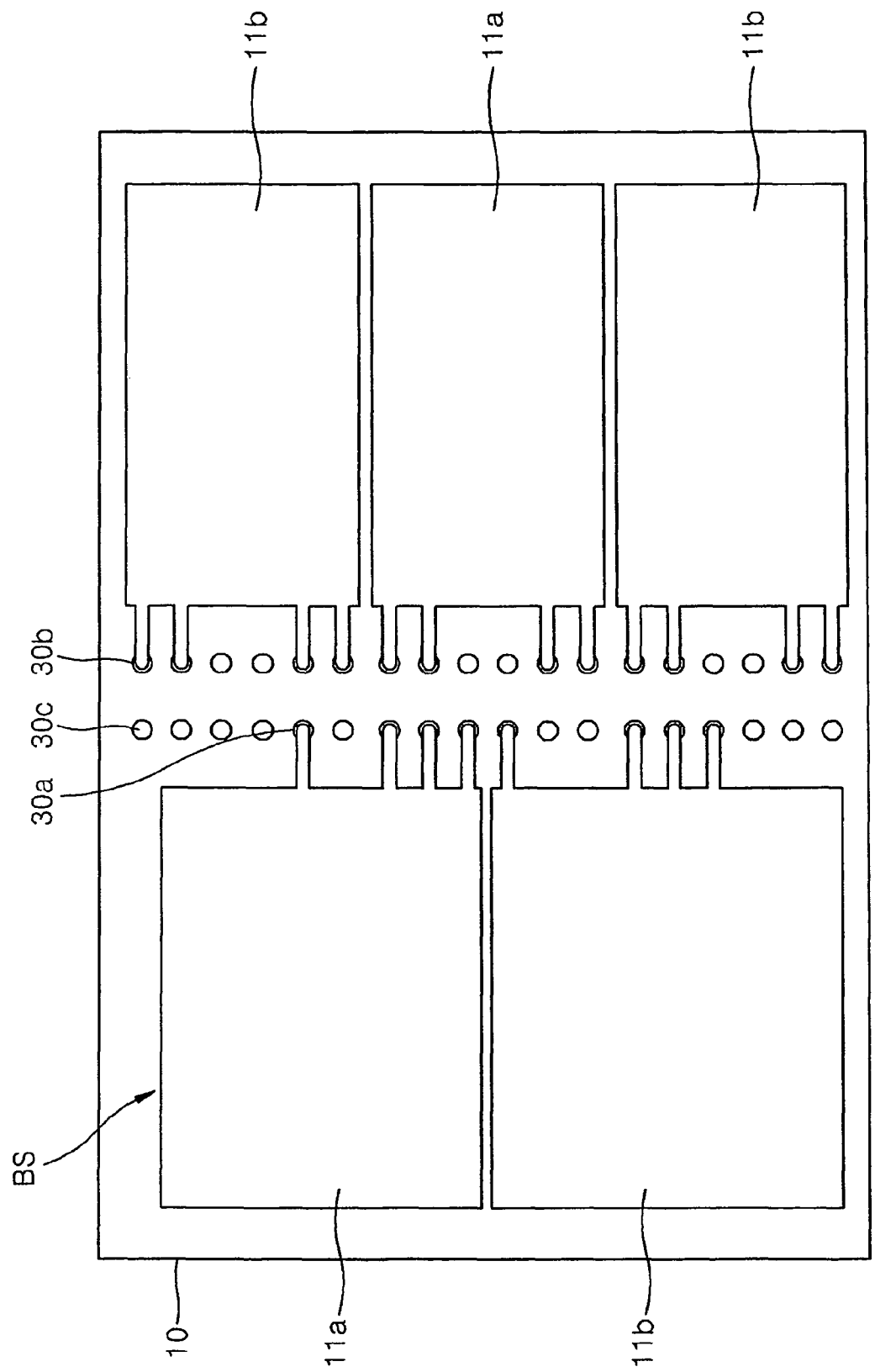
FIG. 6 is a plan view of a backside (BS) of a lowermost semiconductor chip of FIG. 5.

In particular, as shown in FIG. 6, the power planes 11a and the ground planes 11b may be disposed on the left and right sides of the through-silicon vias 30 in consideration of positions of the signal lines 23.

Here, the through-silicon vias 30 operate as conductive connectors 3 that electrically connect the conductive plane 11 to the circuit board 20 and may include power vias 30a, ground vias 30b, and signal vias 30c. The power vias 30a are connected to the power planes 11a, the ground vias 30b are connected to the ground planes 11b, and the signal vias 30c are connected to the signal lines 23.

Accordingly, the through-silicon vias 30 can function to electrically connect the conductive plane 11 to a power and/or ground net (not shown) of the circuit board 20.

Also, as shown in FIG. 6, the power planes 11a and the ground planes 11b can be disposed at left and right sides of the through-silicon vias 30 and can be disposed as a single layer on the same plane on the backside BS of the lowermost semiconductor chip 10.

As shown in FIG. 4, the power plane 11a and the ground plane 11b may be 3-dimensionally stacked in different layers as a double layer on the BS of the semiconductor chips 10. In the embodiment shown, ground plane 11b is stacked on a layer above the power plane 11a. An interlayer insulating layer, such as a nitride layer, an oxide layer, a resin insulating layer, a glass insulating layer, or the like, may be formed between the power and ground planes 11a and 11b that are stacked as a double layer.

Also, the conductive plane 11 may be configured in a number of different arrangements for example, according to type, number, form, and terminal position of power voltages VDD and VDDQ or ground voltages VSS and VSSQ.

Therefore, as shown in FIG. 6, conductive planes 11a and 11b, which are configured to be relatively wide in area and are provided to improve power and/or ground characteristics of the resulting device, can be formed on the BS of the semiconductor chip 10 stacked on the circuit board 20 so as to readily control impedance characteristics of the resulting device without the need for fabricating a multi-layered circuit board. Also, the power and/or ground characteristics the resulting device can be improved to readily control impedance characteristics of the signal lines 23.

A method of fabricating a semiconductor package apparatus according to an embodiment of the present invention will now be described.

As shown in FIG. 4, the semiconductor chip 10 is fabricated. Next, an active plane 12 is formed on a front side of the semiconductor chip 10, and the conductive plane 11 for improving the power and/or ground characteristics is formed on the BS of the semiconductor chip 10. As shown in FIG. 1, the circuit board 20 is fabricated, and the signal lines 23 are formed on a side of the circuit board 20. Thereafter, the semiconductor chip 10 is installed on the circuit board 20 so that the conductive plane 11 of the semiconductor chip 10 is oriented to face, and is electrically connected to, the signal lines 23.

Figure 9:
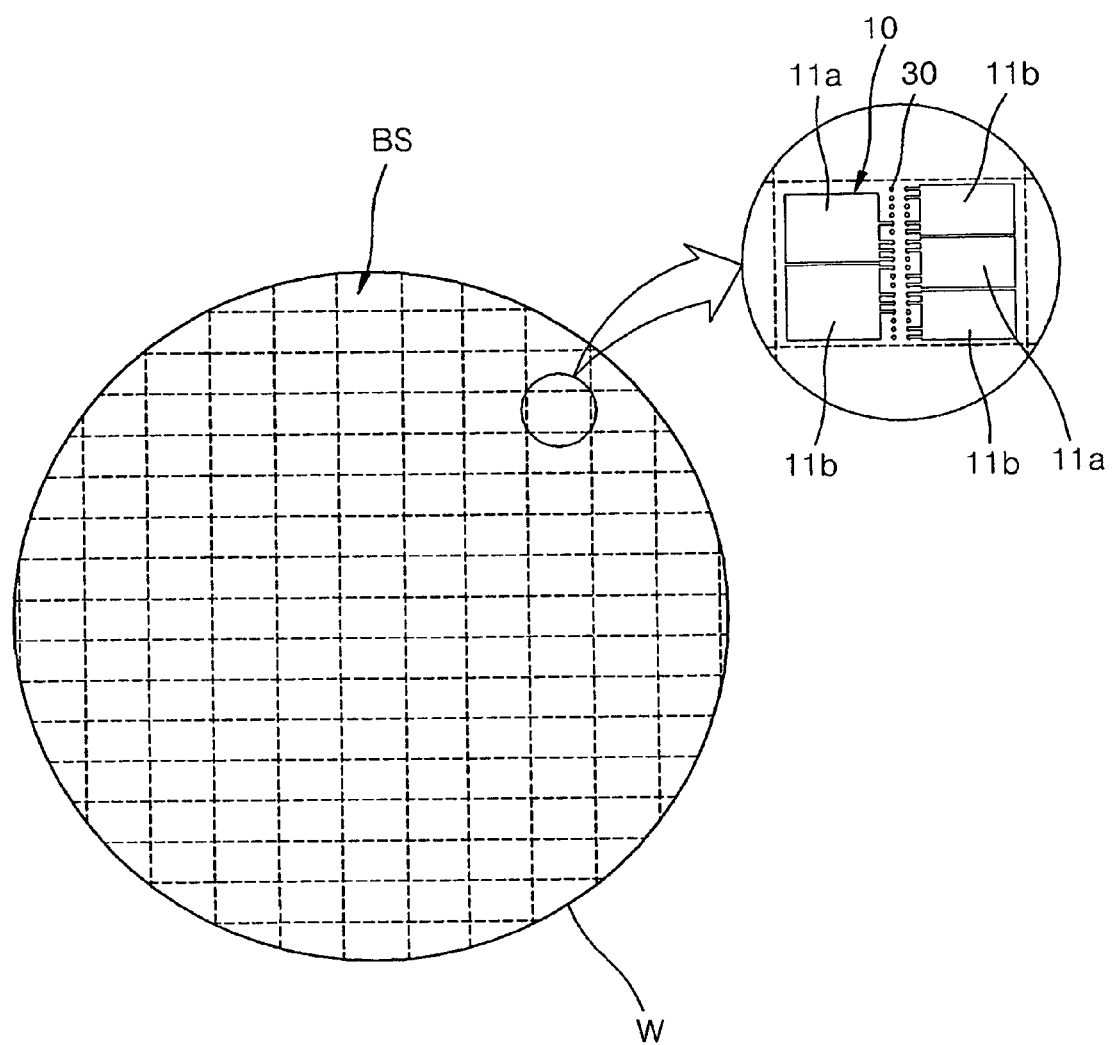
FIG. 9 is a plan view of a conductive plane formed on a backside of wafer in a process of fabricating semiconductor chips in a method of fabricating a semiconductor package apparatus, according to an embodiment of the present invention.

In particular, in the process of fabricating the semiconductor chip 10 in the method of fabricating the semiconductor package apparatus, the conductive plane 11 may be formed on a backside BS of wafer W when the wafer W is fabricated, as shown in FIG. 9.

While embodiments of the present invention have been particularly shown and described with reference to exemplary embodiments thereof, it will be understood by those of ordinary skill in the art that various changes in form and detail may be made herein without departing from the spirit and scope of the present invention as defined by the following claims.

Figure 7:
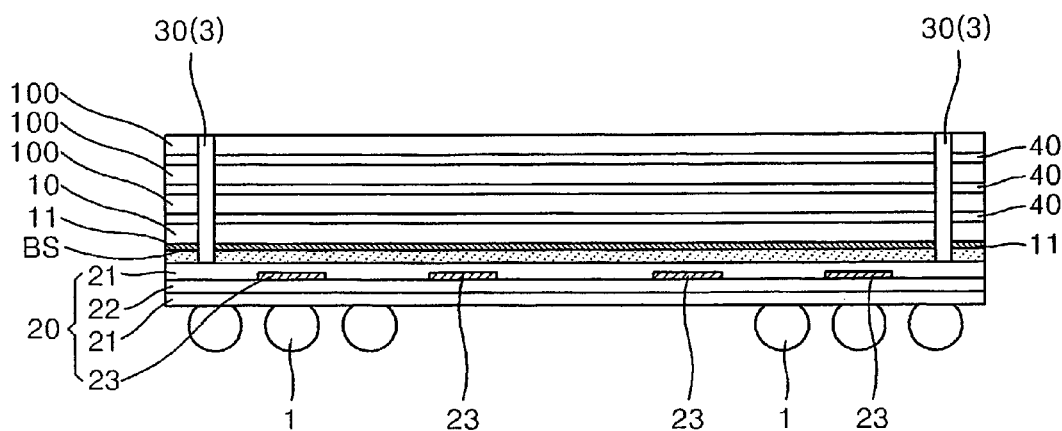
FIG. 7 is a cross-sectional view of a semiconductor package apparatus according to another embodiment of the present invention.

For example, as shown in FIG. 7, the through-silicon vias 30 can comprise through-vias that penetrate the semiconductor chips 100 and 10 in various positions to electrically connect the semiconductor chips 100 and 10 to one another. In the embodiment of FIG. 7, the through-silicon vias 30 penetrate exterior regions of the semiconductor chips 10, 100. In contrast, in the embodiment of FIGS. 1 and 5, the through-silicon vias 30 penetrate interior regions of the semiconductor chips 10, 100.

Figure 8:
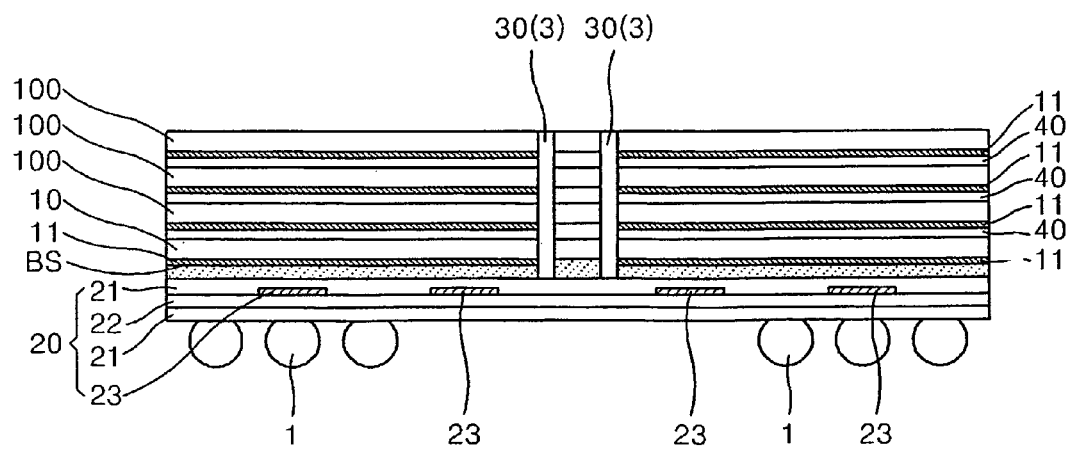

As shown in FIG. 8, instead of forming the conductive plane 11 only on the backside BS of the lowermost semiconductor chip 10 nearest to the signal lines 23 of the circuit board 20, conductive planes 11 may be optionally formed on backside surfaces BSs, or on surfaces opposite the backside surfaces BSs of any or all of the upper semiconductor chips 100.

What is claimed is:

1. A semiconductor package apparatus comprising:
   at least one semiconductor chip;
   a circuit board on which the at least one semiconductor chip is installed; and
   at least one conductive plane constructed and arranged to improve power and/or ground characteristics, wherein the at least one conductive plane is positioned on a backside side of the semiconductor chip.

2. The semiconductor package apparatus of claim 1, wherein the semiconductor package apparatus is a chip stack package type apparatus in which a plurality of semiconductor chips are stacked and electrically connected to one another.

3. The semiconductor package apparatus of claim 2, wherein a conductive plane is positioned on a backside side of each of the plurality of semiconductor chips.

4. The semiconductor package apparatus of claim 1, wherein the at least one semiconductor chip is electrically connected to at least one upper semiconductor chip by a through-silicon via that penetrates the at least one semiconductor chip and the at least one upper semiconductor chip.

5. The semiconductor package apparatus of claim 1, wherein an interlayer adhesive layer is positioned between the at least one semiconductor chip and the circuit board.

6. The semiconductor package apparatus of claim 1, wherein the circuit board comprises a solder resist and a core, wherein signal lines are formed on a side of the core below the solder resist and oriented to face the conductive plane.

7. The semiconductor package apparatus of claim 1, wherein the conductive plane comprises at least one metal plane that is formed of a metal material.

8. The semiconductor package apparatus of claim 1, wherein the conductive plane comprises at least one of a power plane, a ground plane, and a combination of the power and ground planes, wherein the power plane is constructed and arranged to improve a power characteristic, and wherein the ground plane is constructed and arranged to improve a ground characteristic.

9. The semiconductor package apparatus of claim 1, further comprising connectors electrically connecting the at least one conductive plane to the circuit board.

10. The semiconductor package apparatus of claim 9, wherein the connectors comprise at least one through-silicon via that penetrates the at least one semiconductor chip.

11. The semiconductor package apparatus of claim 9, wherein the connectors electrically connect the conductive plane to at least one of a power net and a ground net of the circuit board.

12. The semiconductor package apparatus of claim 1, wherein the conductive plane is formed on a side of the lowermost semiconductor chip nearest to the circuit board.

13. The semiconductor package apparatus of claim 1, wherein multiple conductive planes are disposed on the same plane on a side of the semiconductor chip.

14. The semiconductor package apparatus of claim 1, wherein the conductive plane comprises multiple, stacked conductive planes that are insulated from one another on a backside of the semiconductor chip.

15. A semiconductor package apparatus comprising:
   first and second semiconductor chips;
   a circuit board on which the first and second semiconductor chips are installed; and
   first and second conductive planes positioned between bottom surfaces of the first and second semiconductor chips and the circuit board, respectively, wherein the first and second conductive planes are spaced apart, and wherein the first and second conductive planes are constructed and arranged to improve at least one of power and ground characteristics.

* * * * *